United States Patent [19]

Ishino et al.

[11] Patent Number: 4,539,433

[45] Date of Patent: Sep. 3, 1985

[54] ELECTROMAGNETIC SHIELD

[75] Inventors: Ken Ishino; Yasuo Hashimoto; Yoshikazu Narumiya, all of Tokyo, Japan

[73] Assignee: TDK Corporation, Tokyo, Japan

[21] Appl. No.: 529,991

[22] Filed: Sep. 7, 1983

[30] Foreign Application Priority Data

Nov. 24, 1982 [JP] Japan .................................. 57-204615
Feb. 28, 1983 [JP] Japan .................................. 58-31045

[51] Int. Cl.³ .............................................. H05K 9/00
[52] U.S. Cl. .................................. 174/35 MS; 174/36; 343/18 A
[58] Field of Search ............... 174/35 MS, 35 GC, 36; 219/10.55 D; 333/243; 87/7, 9; 343/18 A

[56] References Cited

U.S. PATENT DOCUMENTS

| | | | |
|---|---|---|---|
| 1,672,979 | 6/1928 | Fondiller | 174/36 |
| 1,697,142 | 1/1929 | Roller | 174/35 MS |
| 2,322,773 | 6/1943 | Peters | 333/243 X |
| 3,126,440 | 3/1964 | Goodloe | 174/35 GC |
| 3,191,132 | 6/1965 | Mayer | 174/36 |
| 3,492,622 | 1/1970 | Hayashi et al. | 174/36 |
| 3,666,876 | 5/1972 | Forster | 174/36 |
| 4,003,840 | 1/1977 | Ishino et al. | 343/18 A X |
| 4,301,428 | 11/1981 | Mayer | 174/36 X |
| 4,371,742 | 2/1983 | Manly | 174/35 MS X |

FOREIGN PATENT DOCUMENTS

| | | | |
|---|---|---|---|
| 2050913 | 4/1972 | Fed. Rep. of Germany | 174/36 |
| 2226378 | 12/1973 | Fed. Rep. of Germany | 174/35 MS |
| 2851388 | 5/1979 | Fed. Rep. of Germany | 174/36 |
| 27556 | 9/1979 | Japan | 343/18 A |
| 114102 | 9/1979 | Japan | 343/18 A |
| 1109008 | 4/1968 | United Kingdom | 174/36 |

*Primary Examiner*—A. T. Grimley
*Assistant Examiner*—Morris H. Nimmo
*Attorney, Agent, or Firm*—Banner, Birch, McKie & Beckett

[57] ABSTRACT

An electromagnetic shielding material for absorbing electromagnetic energy has been found. The shielding material is flexible and has a thin conductive core with a composite ferrite material deposited around the core. The composite ferrite material is a mixture of ferrite powder and a binder for binding the powder. The conductive core may be formed in the shape of a flat sheet or an elongated textile shape. The binder may be a high molecular compound like plastic. When the core is in a textile shape, the textile covered with the composite ferrite material is woven into a cloth which is sufficiently flexible to form around any desired shape.

10 Claims, 7 Drawing Figures

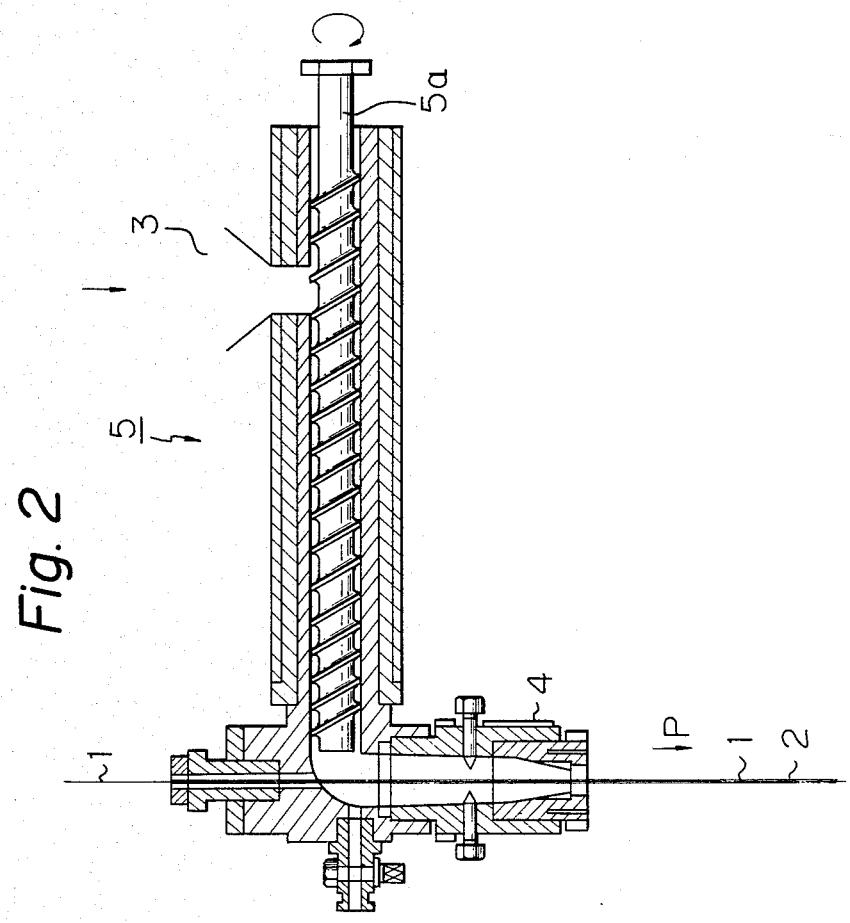

ELECTROMAGNETIC SHIELD

BACKGROUND OF THE INVENTION

The present invention relates to a composite ferrite shield, in particular, relates to a shielding material composed of a textile, which can be used for an electromagnetic shield, an electromagnetic absorbing material and/or other shielding materials.

Conventionally, a sintered bulk ferrite body has been used as an electromagnetic shielding material, or as an electromagnetic absorbing material. However, ferrite material has the disadvantages that it is easily broken and is difficult to manufacture into complicated material shapes. In order to solve the above problems, a composite ferrite material, like gum ferrite which is a composite of ferrite powder and a high-molecular compound like plastic, has been used. The composite ferrite material has the advantages that its structure is strong and can be manufactured into complicated structures easily. The composite ferrite material is manufactured by injection molding, extrusion, and/or compression molding.

However, composite ferrite material which is formed in a flate plate shape still has the disadvantage that it cannot be easily used in manufacturing processes and its flexibility is not sufficient.

SUMMARY OF THE INVENTION

It is an object, therefore, of the present invention to overcome the disadvantages and limitations of prior electromagnetic shielding materials by providing a new and improved electromagnetic shielding material.

It is also an object of the present invention to provide a flexible electromagnetic shielding material which has high electromagnetic energy absorbing capability.

The above and other objects are attained by an electromagnetic shielding material comprising a flexible conductive core and a composite ferrite material which is a mixture of ferrite powder and a binder for binding the same, the composite ferrite material being deposited around the conductive core.

Preferably, the conductive core is formed in an elongated thin shape and the completed shielding material is formed in a textile shape so that the material can be woven into a flexible cloth.

In one embodiment, the conductive core is flat and thus, the completed shielding material is flat in shape.

Preferably, the conductive core has a center textile which is not conductive and a conductive coil winding said center textile.

The volume ratio of ferrite powder to composite ferrite material is preferably in the range between 0.2 and 0.8.

BRIEF DESCRIPTION OF THE DRAWINGS

The foregoing and other objects, features, and attendant advantages of the present invention will be appreciated as the invention becomes better understood by means of the following description and accompanying drawings wherein;

FIG. 2 shows the manufacturing system for the material of FIG. 1.

DESCRIPTION OF THE PREFERRED EMBODIMENTS

The present electromagnetic shield has, in general, a structure which has a center conductor and a ferrite material deposited on the center conductor. With this structure, when the material is placed in an electromagnetic field, current flows in the center conductor which then provides an ohmic loss, and further, generates an electric field around the conductor. The electric field generated by the center conductor is then attenuated by the magnetic loss by the ferrite material. Theoretically speaking, when the complex permeability of the ferrite material is expressed as $\mu = \mu' - j\mu''$, the tan $(\delta_\mu)$ which represents the loss is expressed as $$\tan(\delta_\mu) = \mu''/\mu'$$

where $\mu'$ is the real part of the permeability, and $\mu''$ is the imaginary part of the same.

Thus, the structure with a center conductor covered with ferrite material has the property that it absorbs electromagnetic energy.

Figure 1:
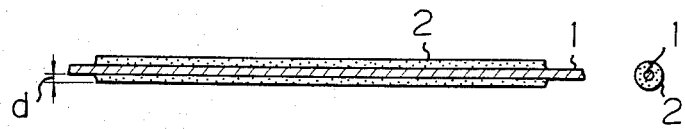
FIG. 1 is the cross sectional view for the composite shielding material according to the present invention.

FIG. 1 shows a cross section of the electromagnetic shielding material according to the present invention. In the figure, reference numeral 1 is an elongated center conductor made of a textile, numeral 2 is a composite ferrite material covering center conductor 1. Composite ferrite material 2 is a mixture of ferrite powder and a high molecular compound like plastic. The mixing volume ratio of ferrite powder to the mixture is preferably in the range between 0.2 and 0.8. If the ratio is higher than 0.8, the mixture would lose flexibility, and if the ratio is less than 0.2, the electromagnetic energy would not be sufficiently absorbed. Thickness (d) of the mixture is 1-5 mm. Center conductor I is made of carbon textile or acrylic resin dispersed with copper ions. In one embodiment, center conductor I may be formed from a mixture of a conductive textile like carbon and a dielectric textile like acrylic resin or glass. In that case, the center conductor will have strong tension.

Preferably, the diameter of ferrite mixture 2 is larger than twice the diameter of center core 1 so that sufficient attenuation is obtained.

FIG. 2 shows the manufacturing process of the electromagetic shield of FIG. 1. In the figure, the mixture of ferrite powder is stored in hopper 3 and the high molecular compound (silicon rubber in this embodiment) is stored in cylinder 5 of the extruder. Conductive textile 1 is pulled in direction P perpendicular to screw axis 5a which rotates to extrude the mixture in the liftward direction of the drawing. Conductive textile 1 is covered with the mixture, and then, the textile with the cover is obtained from die 4 which determines the shape of the product. The extension of textile 1 and the pressure of mixture 3 are adjusted so that the desired product is obtained. It should be noted that the process of FIG. 2 is the same as the process of manufacturing electric wire which has a center conductor covered with insulation material.

Composite ferrite material 3 is, in this embodiment, a mixture of $N_i$-$Z_n$ ferrite powder with an average diameter of 2 microns which is ground after sintering at 1250° C. $M_n$-$Z_n$ ferrite powder is also available. These ferrite materials ($N_i$-$Z_n$ ferrite, and $M_n$-$Z_n$ ferrite) provide high permeability and high magnetic losses. The center conductor also provides the ohmic losses for the electromagnetic wave. When the real part of the complex dielectric constant of the textile is ($\epsilon'=6$), and the imaginary part of the same is ($\epsilon''=24$), the ohmic loss is tan $(\delta\epsilon)=(\epsilon''/\epsilon')=4$, and therefore, the conductive textile provides a large ohmic loss. Accordingly, the shielding material of FIG. 1 provides both a magenetic loss and an ohmic loss to absorb electromagnetic energy.

It should be appreciated that the structure of FIG. 1 is flexible and is strong since it has a center conductor of textile covered with composite ferrite material. The composite textile of FIG. 1 is woven into a cloth, which is also flexible enough to fit within any desired shape. The cloth operates an electromagnetic absorbing wall.

The present composite ferrite absorber is excellent for attenuating electromagnetic waves because of its structure with a conductor and a ferrite cover. The attenuation characteristics of the present absorber and a conventional ferrite absorber (which has no center conductor) are shown in the table 1.

TABLE 1

| Sample | Frequency | | | |
|---|---|---|---|---|
| | 10 MHz | 100 MHz | 1 GHz | 10 GHz |
| (1) | 3 dB | 5 dB | 10 dB | 15 dB |
| (2) | 5 dB | 8 dB | 13 dB | 18 dB |
| (3) | 15 dB | 25 dB | 35 dB | 40 dB |
| (4) | 20 dB | 30 dB | 40 dB | 45 dB |

Sample (1) is a conventional composite ferrite material with a diameter of 3 mm (no center conductor), sample (2) is a conventional composite ferrite material with a diameter of 5 mm (no center conductor) sample (3) is the structure of FIG. 1 with a center conductor having a diameter of 0.5 mm covered with a composite ferrite material with a diameter 3 mm, and sample (4) is the structure of FIG. 1 with a center conductor having a diameter of 1.0 mm covered with a composite ferrite material with a diameter of 5.0 mm.

It should be appreciated that the structure of the present electromagnetic shield weaved with the textile of FIG. 1 is flexible enough to use with any complicated structure and is excellent for absorbing electromagnetic energy.

Figure 3:
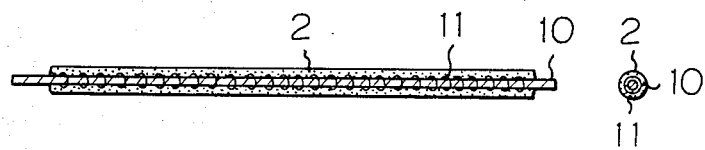
FIG. 3 is a cross section of another embodiment of the shielding material according to the present invention, FIG. 4A and FIG. 4B illustrative another embodiment of the shielding material according to the present invention.

FIG. 3 shows another embodiment of the present invention. In this figure, the reference numeral 10 is an elongated non-conductive textile-like high molecular compound, and reference No. 11 is a conductive coil wound around non-conductive textile 10. Therefore, the structure with non-conductive textile 10 and conductive coil 11 is electrically similar to the conductive core 1 of FIG. 1. The cores (10, 11) are covered with composite ferrite material 2 which is a mixture of ferrite powder and the high molecular compound. The mixing volume ratio of ferrite to the mixture is in the range between 0.2 and 0.8 as is the case of the embodiment of FIG. 1. Textile 10 operates to provide strength to the shield material. The material of coil 11 is carbon textile or acrylic resin dispersed with copper ions.

The embodiment of FIG. 3 has the feature that composite ferrite material 2 is strongly coupled with the elongated core (10,11) and the ohmic losses of the shield increases because the total length of conductor 11 is longer than that of FIG. 1.

Figure 4A:
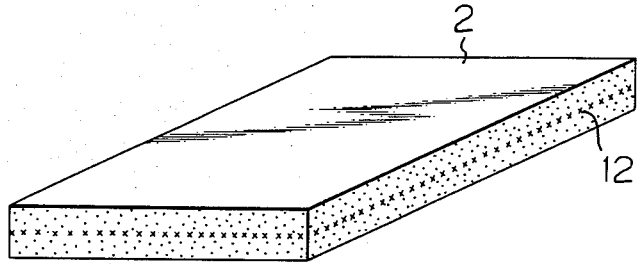
Figure 4B:
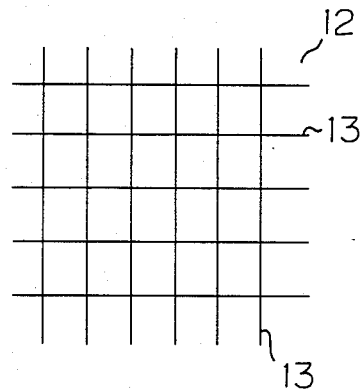

FIGS. 4A and 4B show still another embodiment of the present electromagnetic shield in which conductive wire 13 (FIG. 4B) is woven to provide net 12 as shown in FIG. 4B, and composite ferrite material 2 is deposited on both sides of net 12 as shown in FIG. 4A. The structure of FIG. 4A is also flexible and can be formed with any desired outside shape. The mixing volume ratio of ferrite powder to the mixture is also in the range between 0.2 and 0.8.

Figure 5:
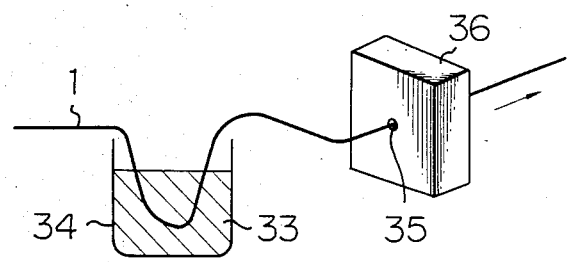
FIG. 5 shows another embodiment of the manufacturing system for producing the shielding material of FIG. 1.

FIG. 5 shows another embodiment for producing the shield textile of FIG. 1. In FIG. 5, composite ferrite in a liquid state is contained in basin 34. Textile 1 is dipped into composite ferrite liquid 33 then pulled through hole 35 with a predetermined diameter on die 36. Then, the composite textile is dried. The process of FIG. 5 is repeated a plurality of times so that the cover has the desired thickness.

Figure 6:
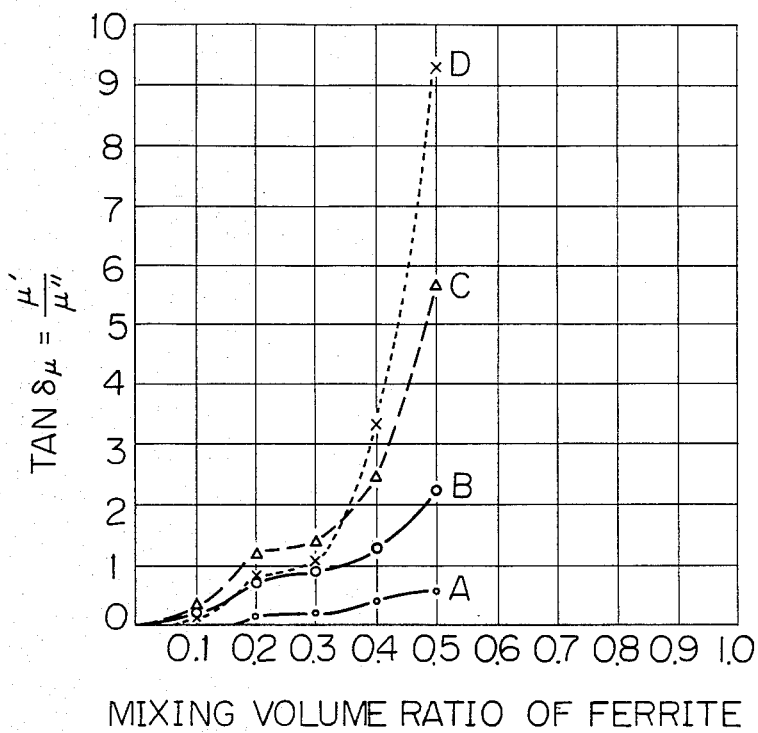
FIG. 6 shows the relationship between the mixing volume ratio of the ferrite powder and the electromagnetic energy attenuation.

FIG. 6 shows the experimental curves between the mixing volume ratio of the ferrite powder to the ferrite mixture, and the losses $(\tan(\delta_\mu)=\mu''/\mu')$, in which the curve A shows data for an average diameter of ferrite powder of 3 microns at a frequency of 2450 MHz, curve B shows that data average diameter of ferrite powder of 2 microns at a frequency of 100 MHz, curve C shows data of an average diameter of ferrite powder of 2 microns and the frequency of 500 MHz, at a curve D shows data of an average diameter of ferrite powder is 2 microns at a frequency of 1000 MHz. The sample ferrite is $N_i$-$Z_n$ group ferrite, which is mixed with silicon rubber. As is apparent from the curves of FIG. 6, when the mixing volume ratio is less than 0.2, the losses are not sufficient. Therefore, the mixing volume ratio of the ferrite powder to the mixture is selected to be higher than 0.2 in the present invention. On the other hand, when the ratio is higher than 0.8, the mixture is too hard to be formed into desired shapes. Therefore, the ratio is selected between 0.2 and 0.8.

As described above, according to the present invention, the electromagnetic shield has a flexible textile core and a composite ferrite material covering the core. Therefore, the resultant shield material is flexible and has strong tensile strength. Further, due to the presence of a center conductor covered with ferrite material, electromagnetic wave are well absorbed. Some of the application fields of the present invention are an electromagnetic shield for a shield room for experiments, shielding material of a coupler of the cable for high frequency transmission, an electromagnetic seal for a microwave oven, a seal for the housing of a computer, etc.

From the foregoing, it will now be apparent that a new and improved electromagnetic shield has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A cloth electromagnetic shield, said shield comprising:
   a flexible textile member which is substantially electrically conductive;

a ferrite layer deposited around said textile member, said ferrite layer being a mixture of ferrite powder and a binder for binding said ferrite powder so that the volume ratio of said ferrite powder to the mixture is in the range of 0.2 to 0.8, wherein said cloth is woven from said textile member.

2. An electromagnetic shield according to claim 1, wherein said textile member is formed of carbon textile dispersed with copper ions.

3. An electromagnetic shield according to claim 3, wherein said textile member is elongated and circular in construction.

4. An electromagnetic shield according to claim 1, wherein the thickness of said textile member with said ferrite layer is in the range between 3 mm and 5 mm.

5. An electromagnetic shield according to claim 2, wherein the thickness of said textile member with said ferrite layer is larger than twice the thickness of said textile member.

6. An electromagnetic shield according to claim 3, wherein the diameter of said textile member with said ferrite layer is larger than twice the diameter of said textile member.

7. An electromagnetic shield according to claim 1, wherein said ferrite layer is $N_i$-$Z_n$ group ferrite.

8. An electromagnetic shield according to claim 1, wherein said textile member is formed from carbon textile.

9. An electromagentic shield according to claim 1, wherein said textile member is formed from the mixed spinning of conductive textile and dielectric textile.

10. An electromagnetic shield according to claim 1, wherein said textile member is formed of acrylic resin dispersed with copper ions.

* * * * *